United States Patent
Park et al.

(10) Patent No.: US 7,394,139 B2
(45) Date of Patent: Jul. 1, 2008

(54) OPTICAL MODULATOR MODULE PACKAGE USING FLIP-CHIP MOUNTING TECHNOLOGY

(75) Inventors: Heung Woo Park, Seoul (KR); Yeong Gyu Lee, Gyeonggi-do (KR); Suk Kee Hong, Seoul (KR); Chang Su Park, Gyeonggi-do (KR); Ohk Kun Lim, Gyeonggi-do (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 173 days.

(21) Appl. No.: 11/347,187

(22) Filed: Feb. 3, 2006

(65) Prior Publication Data
US 2006/0198000 A1    Sep. 7, 2006

(30) Foreign Application Priority Data
Mar. 7, 2005  (KR) .................... 10-2005-0018734

(51) Int. Cl.
*H01L 27/14*    (2006.01)
*H01L 31/00*    (2006.01)

(52) U.S. Cl. .................. 257/431; 257/434; 257/457; 257/469; 359/10

(58) Field of Classification Search .............. 257/777, 257/783, 786, 431–434, 457, 459, 467, 469
See application file for complete search history.

(56) References Cited

U.S. PATENT DOCUMENTS

| | | | |
|---|---|---|---|
| 6,303,986 B1 * | 10/2001 | Shook | 257/680 |
| 6,872,984 B1 * | 3/2005 | Leung | 257/81 |
| 7,098,535 B2 * | 8/2006 | Lee et al. | 257/738 |
| 7,102,240 B2 * | 9/2006 | Park et al. | 257/778 |
| 7,227,267 B2 * | 6/2007 | Lee et al. | 257/778 |

* cited by examiner

*Primary Examiner*—Zandra Smith
*Assistant Examiner*—Telly D Green
(74) *Attorney, Agent, or Firm*—Christensen O'Connor Johnson Kindness PLLC

(57) ABSTRACT

Disclosed herein is an optical modulator module package using a flip-chip mounting technology, in which an optical modulator device is hermetically mounted using the flip-chip mounting technology. The optical modulator device is protected from an external environment, it is easy to transmit an electrical signal to the exterior, and optical characteristics of the optical modulator device are desirably maintained.

4 Claims, 11 Drawing Sheets

OPTICAL MODULATOR MODULE PACKAGE USING FLIP-CHIP MOUNTING TECHNOLOGY

BACKGROUND OF THE INVENTION

1. Field of the Invention

The present invention relates, in general, to an optical modulator module package and, more particularly, to an optical modulator module package using a flip-chip mounting technology, in which easy electrical signal transmission between an optical modulator device and driver integrated circuits and hermetic mounting to desirably maintain characteristics of the optical modulator device are simultaneously achieved using the flip-chip mounting technology.

2. Description of the Related Art

Recently, many applications and products have been developed using a micro electromechanical system (MEMS) technology, and are used in daily life.

Most MEMS products comprise movable components, and are affected by surface energy rather than energy caused by mass, due to a micrometer($\mu$m)-sized fine structure.

Accordingly, in order to assure stable and reliable performance of the products, movement of movable structures must be shielded from mechanical and chemical external factors and be separated from factors capable of affecting surface energy. To satisfy the above-mentioned demand, a study has been made of hermetic packaging for a MEMS device.

Currently, in the case of a reflective diffraction type of optical modulator among MEMS devices, in comparison with integration of the optical modulator and driver integrated circuits on the same device, it is believed more preferable to form the driver integrated circuits on another device so as to form a hybrid-type structure by modularization, in terms of yield and cost. Thus, production of the hybrid type is common.

Since the optical modulator device uses light, unlike a conventional device, conventional modularized structures and modularization processes cannot be used and should be mostly modified. Particularly, an optical modulator device is susceptible to moisture due to movement of active devices, thus hermetic mounting is necessary. Additionally, it is preferable to integrate an integrated device for driving the optical modulator device on the same device or to mount the integrated device in the same housing so as to produce a compact module structure and to make signal connection to the exterior easy.

Hermetic packaging of the conventional optical modulator device is generally conducted through a soldering method using attachment of a metal by fusion.

FIG. 1 is a sectional view of a conventional optical modulator device package, which is disclosed in U.S. Pat. No. 6,303,986.

As shown in FIG. 1, in the optical modulator device package disclosed in U.S. Pat. No. 6,303,986, solderable materials 120, 124 which are formed on a cover 122 and a passivation layer 114 are packaged using solders 126. This soldering method is capable of assuring excellent hermetic property and reliability of MEMS products.

However, in views of price competitiveness, yield, processability, and miniaturization, it is necessary to reduce the sizes of an optical modulator device and a module, thus there is growing a need to modify the structure and method of electrical signal connection between the optical modulator device and external driver integrated circuits, and a sealing structure.

SUMMARY OF THE INVENTION

Accordingly, the present invention has been made keeping in mind the above problems occurring in the prior art, and an object of the present invention is to provide an optical modulator module package using a flip-chip mounting technology, in which an optical modulator device is optimally hermetically mounted, an electrical signal is easily transmitted, and desirable optical characteristics are maintained. In the present invention, electric interconnection and hermetic mounting are simultaneously achieved through a single process.

In order to accomplish the above object, an optical modulator module package using a flip-chip mounting technology according to the present invention comprises an optical modulator device and a light transmissive cover. The optical modulator device comprises micromirrors, formed on a lower side thereof, to modulate light incident from an exterior, upper metal pads which are spaced apart from at least one side of the micromirrors to transmit an electrical signal from the exterior to the micromirrors therethrough, and an upper sealing pad, which is formed between the micromirrors and the upper metal pads to surround the micromirrors. The light transmissive cover comprises lower metal pads which are formed thereon to correspond in position to the upper metal pads of the optical modulator device, and a lower sealing pad which is formed to correspond in position to the upper sealing pad of the optical modulator device.

In a preferred embodiment, the optical modulator module package using the flip-chip mounting technology according to the present invention further comprises at least one driver integrated circuit which is formed around the optical modulator device connected to the light transmissive cover so as to provide driving voltage to the optical modulator device depending on the electrical signal input from the exterior, and a printed circuit board which is attached to a lower side of the light transmissive cover and through which holes are formed to pass incident light therethrough.

In another preferred embodiment, in the optical modulator module package using the flip-chip mounting technology according to the present invention, it is preferable that at least one connection of the connection of the upper metal pads of the optical modulator device and the lower metal pads of the light transmissive cover, and the connection of the upper sealing pad of the optical modulator device and the lower sealing pad of the light transmissive cover, be conducted using a solder ball.

In another preferred embodiment, in the optical modulator module package using the flip-chip mounting technology according to the present invention, it is preferable that the upper metal pads of the optical modulator device and the lower metal pads of the light transmissive cover be connected to each other using an anisotropic conductive film (ACF) or a non-conductive film (NCF) so as to avoid bending of the device or nonuniform heights of bumps, thus assuring stable performance.

In another preferred embodiment, in the optical modulator module package using the flip-chip mounting technology according to the present invention, it is preferable that at least one connection of the connection of the upper metal pads of the optical modulator device and the lower metal pads of the light transmissive cover, and the connection of the upper sealing pad of the optical modulator device and the lower sealing pad of the light transmissive cover, be conducted using the anisotropic conductive film.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Hereinafter, a detailed description will be given of an optical modulator module package using a flip-chip mounting technology according to the present invention, referring to the accompanying drawings.

Figure 1:
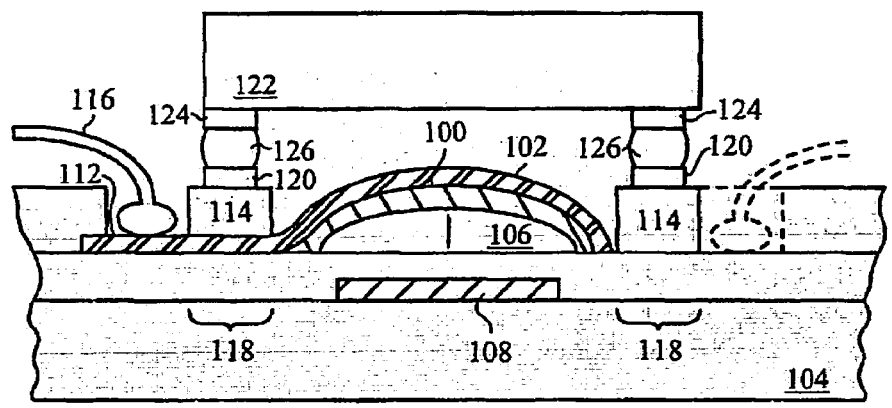
FIG. 1 is a sectional view of a conventional optical modulator device package.
Figure 2A:
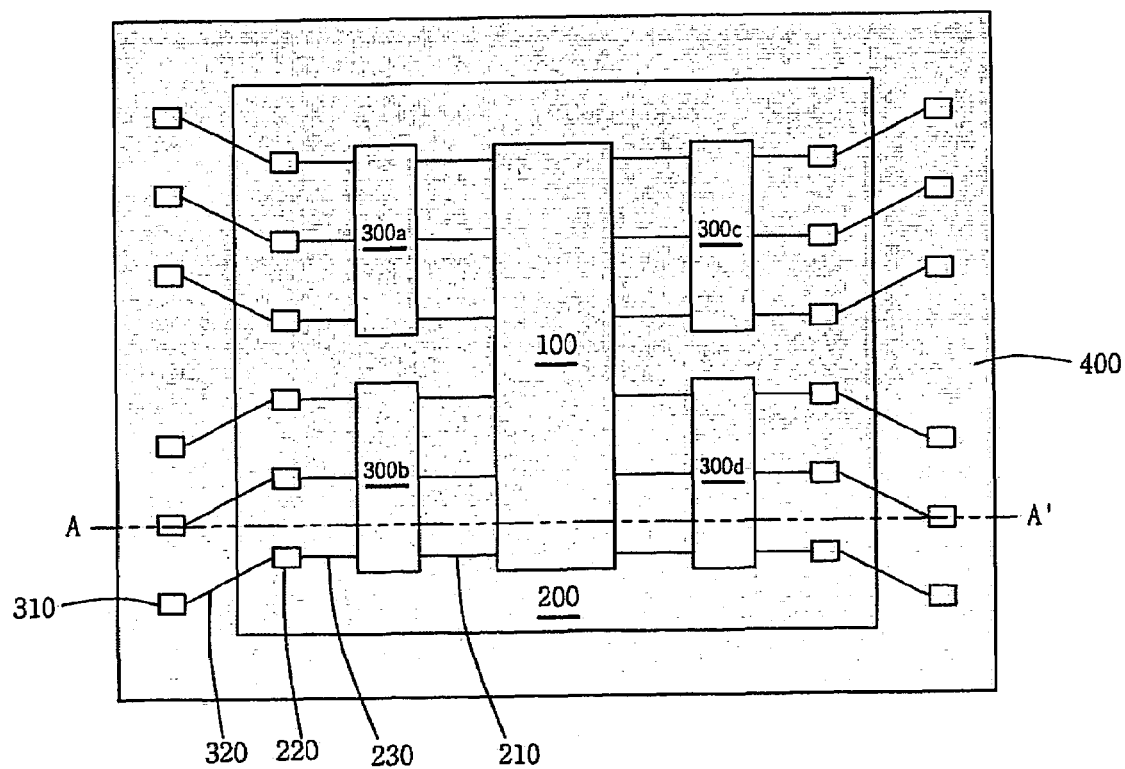
FIG. 2A is a plan view of an optical modulator module package using a flip-chip mounting technology according to the first embodiment of the present invention.
Figure 2B:
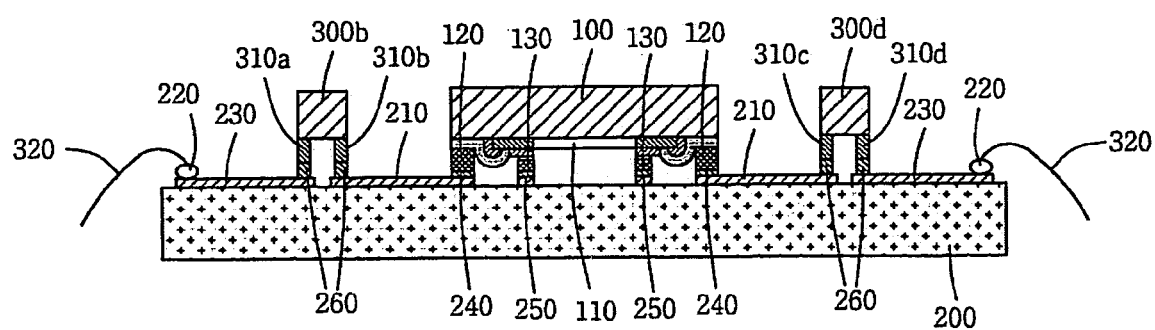
FIG. 2B is a sectional view of the optical modulator module package using the flip-chip mounting technology according to the first embodiment of the present invention, which is taken along the line A-A' of FIG. 2A.
Figure 3A:
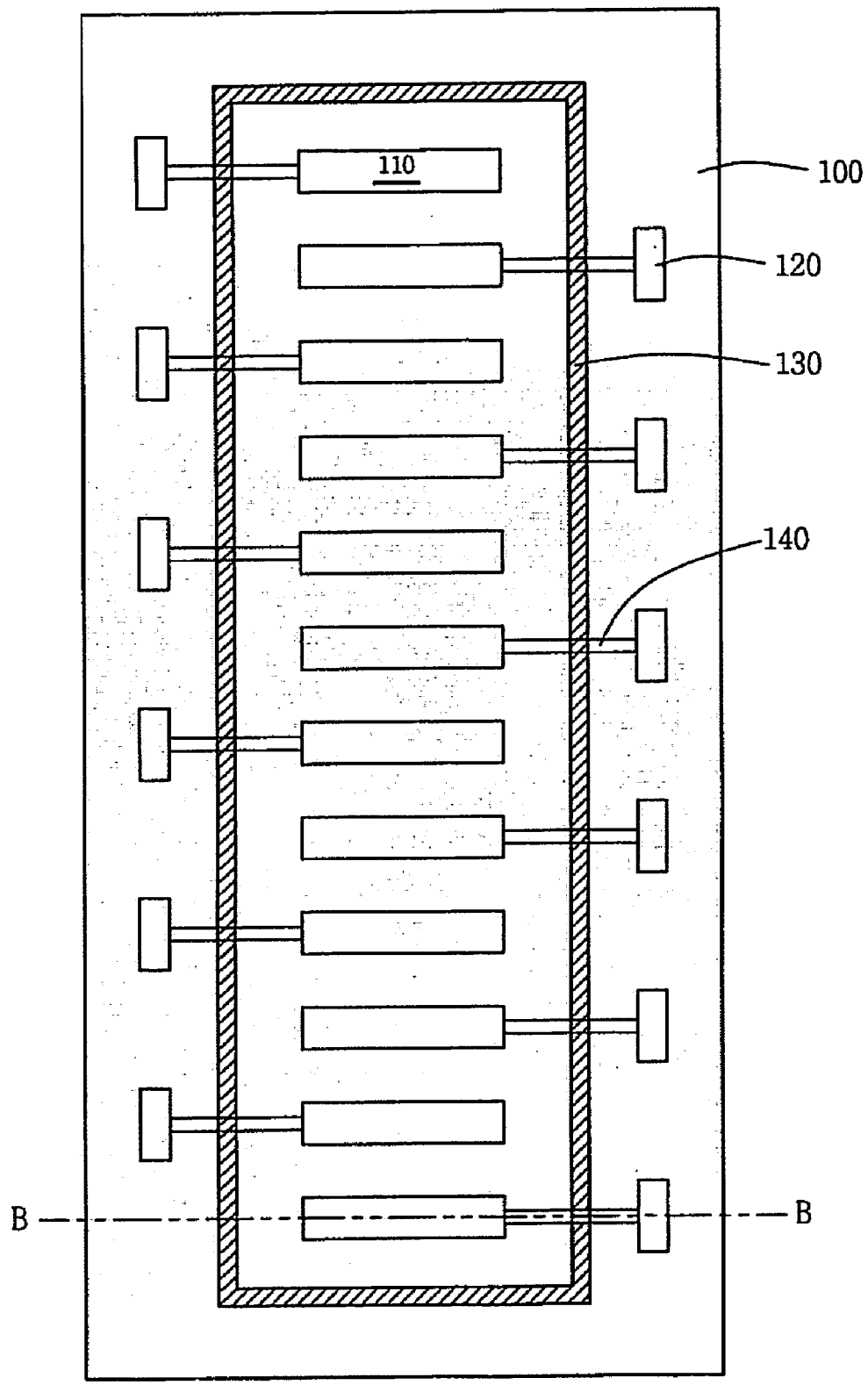
FIG. 3A is a bottom view of an optical modulator device according to the first embodiment of the present invention.
Figure 3B:
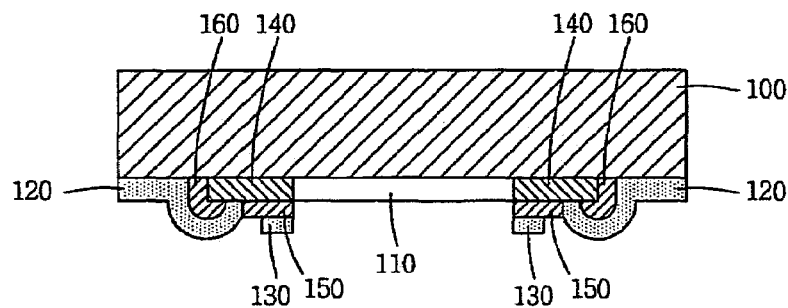
FIG. 3B is a sectional view of the optical modulator device according to the first embodiment of the present invention, which is taken along the line B-B' of FIG. 3A.
Figure 4A:
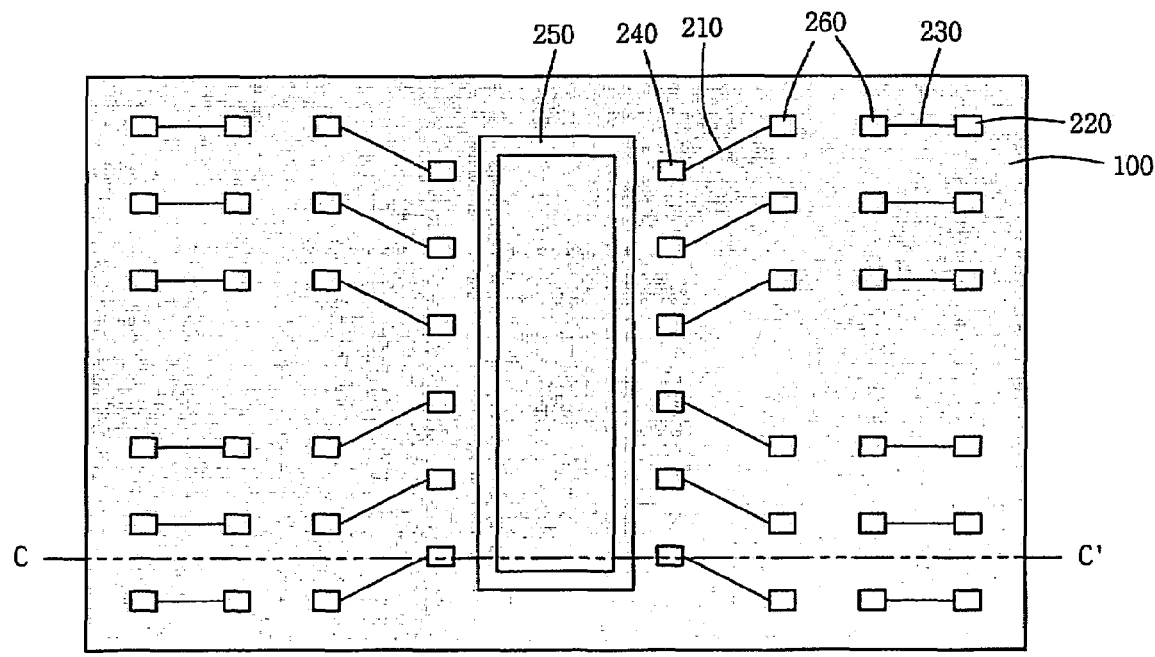
FIG. 4A is a plan view of a light transmissive cover according to the first embodiment of the present invention.
Figure 4B:
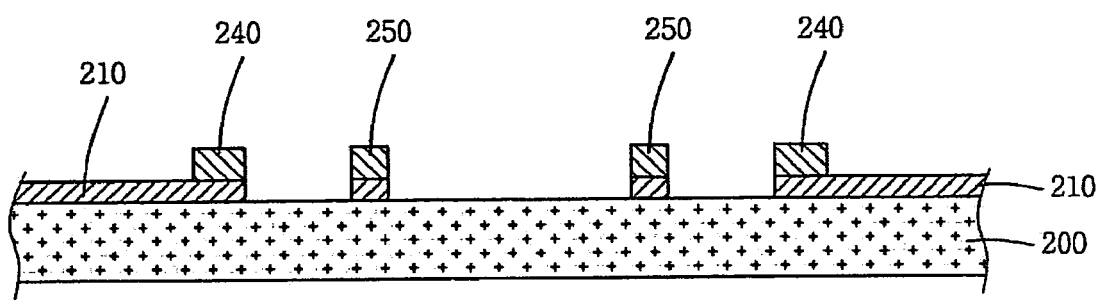
FIG. 4B is a sectional view of the light transmissive cover according to the first embodiment of the present invention, which is taken along the line C-C' of FIG. 4A.
Figure 5:
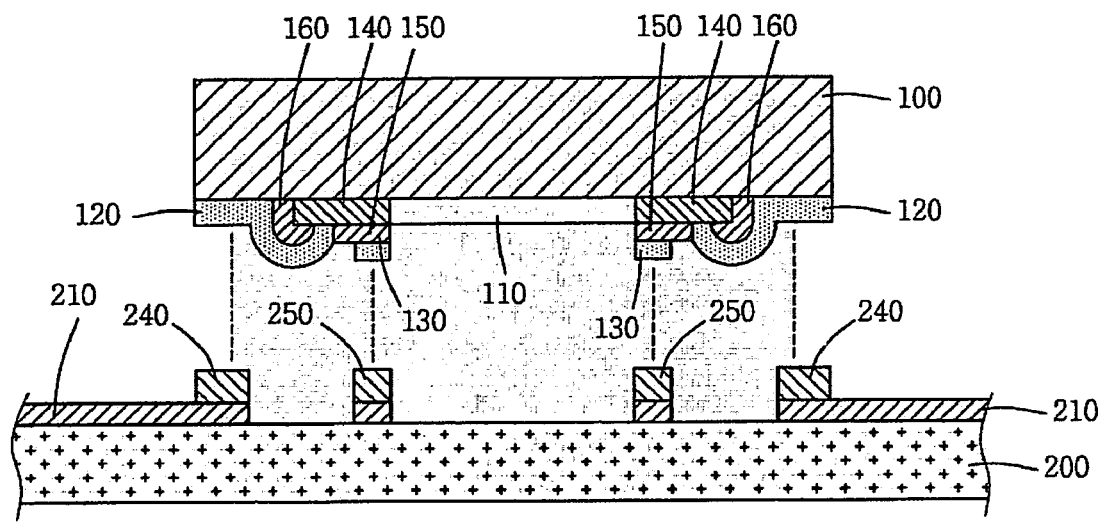
FIG. 5 is a sectional view showing attachment of the optical modulator device to the light transmissive cover according to the first embodiment of the present invention.

FIG. 2A is a plan view of an optical modulator module package using a flip-chip mounting technology according to the first embodiment of the present invention, FIG. 2B is a sectional view of the optical modulator module package using the flip-chip mounting technology according to the first embodiment of the present invention, which is taken along the line A-A' of FIG. 2A, FIG. 3A is a bottom view of an optical modulator device according to the first embodiment of the present invention, FIG. 3B is a sectional view of the optical modulator device according to the first embodiment of the present invention, which is taken along the line B-B' of FIG. 3A, FIG. 4A is a plan view of a light transmissive cover according to the first embodiment of the present invention, FIG. 4B is a sectional view of the light transmissive cover according to the first embodiment of the present invention, which is taken along the line C-C' of FIG. 4A, and FIG. 5 is a sectional view showing attachment of the optical modulator device to the light transmissive cover according to the first embodiment of the present invention.

With reference to FIGS. 2A and 2B, the optical modulator module package using the flip-chip mounting technology according to the present invention comprises an optical modulator device 100, a light transmissive cover 200, a plurality of driver integrated circuits 300a, 300b, 300c, 300d, and a printed circuit board 400.

The optical modulator device 100 modulates light incident through the light transmissive cover 200 using micromirrors 110 to diffract light.

In detail, referring to FIGS. 3A and 3B, the optical modulator device 100 comprises the micromirrors 110, upper metal pads 120, an upper sealing pad 130, lead wires 140, and insulating layers 150, 160.

A plurality of micromirrors 110 is formed on a lower side of the optical modulator device 100 at regular intervals, and modulates light incident from the exterior to diffract light.

The upper metal pads 120 are spaced apart from the sides of the micromirrors 110, and transmit an electrical signal inputted from the exterior through the lead wires 140 to the micromirrors 110. It is preferable that the upper metal pads 120 be metal layers including Au as a main component so that adhesion strength to lower metal pads 240 of the light transmissive cover 200 is excellent, and it is more preferable to form a Au layer after a thin Cr layer is formed so as to improve adhesion strength between the optical modulator device 100 and the Au layer. In an embodiment, every upper metal pad 120 corresponds to one micromirror 110. But the upper metal pads 120 may be formed so as to be spaced apart from both sides of the micromirror 110 in order to transmit more electrical signals.

The upper sealing pad 130 is formed between the micromirrors 110 and the upper metal pads 120 so as to surround a plurality of micromirrors 110, and seals the micromirrors 110 so as to shield the micromirrors 110 from an external environment (particularly, moisture). It is preferable that the upper sealing pad 130 be a metal layer including Au as a main component so that adhesion strength of the light transmissive cover 200 to a lower sealing pad 250 is excellent, and it is more preferable to form a Au layer after a thin Cr layer is formed so as to improve adhesion strength between the insulating layer 150 and the Au layer.

The lead wires 140 are formed to connect the micromirrors 110 and the upper metal pads 120 to each other, and transmit an electrical signal from the upper metal pads 120 to the micromirrors 110 therethrough. Preferably, the lead wires 140 are formed in conjunction with the micromirrors 110 simultaneously, and are metal layers including Pt or the like.

The insulating layers 150 are formed between the lead wires 140 and the upper sealing pad 130 to provide insulation therebetween, and include oxide materials, such as $SiO_2$. Furthermore, the insulating layers 160 may be formed on walls of the lead wires 140.

The light transmissive cover 200 is attached to the optical modulator device 100 and a plurality of driver integrated circuits 300a, 300b, 300c, 300d at an upper side thereof, and to the printed circuit board 400 at a lower side thereof. It is preferable that the light transmissive cover 200 be made of a light transmissive material of superior quality (for example, glass) so as to nicely transmit incident light therethrough.

Furthermore, it is preferable that the upper side or the lower side of the light transmissive cover 200 be subjected to a non-reflective coating process so as to prevent light from being absorbed thereon or to prevent diffused reflection.

In detail, referring to FIGS. 4A and 4B, the light transmissive cover 200 comprises first circuit patterns 210, wire bonding pads 220, second circuit patterns 230, lower metal pads 240, the lower sealing pad 250, and lower pads 260 for driver integrated circuits.

The first circuit patterns 210 are formed between the lower metal pads 240 and the lower pads 260 for driver integrated circuits to transmit electrical signals from the driver integrated circuits 300a, 300b, 300c, 300d through the lower metal pads 240 to the micromirrors 110. The first circuit patterns 210 may be made of any material as long as it has excellent electrical conductivity. However, it is preferable that the first circuit patterns 210 be metal layers including Au as a main component so that adhesion strength to lower metal pads 240 is excellent, and it is more preferable to form a Au layer after a thin TiW layer is formed so as to improve adhesion strength between the light transmissive cover 200 and the Au layer.

The wire bonding pads 220 are formed on an edge of the light transmissive cover 200 to be wire-bonded 320 to wire bonding pads 310 of the printed circuit board 400.

The second circuit patterns 230 are formed between the lower pads 260 for the driver integrated circuits and the wire bonding pads 220, and transmit electrical signals from the wire bonding pads 220 to the lower pads 260 for the driver integrated circuits on the printed circuit board 400.

The lower metal pads 240 are formed to correspond in position to the upper metal pads 120 of the optical modulator device 100 attached to the light transmissive cover 200, and transmit electrical signals from the driver integrated circuits 300a, 300b, 300c, 300d to the optical modulator device 100. It is preferable that the lower metal pads 120 be metal layers including Au as a main component so that adhesion strength to the upper metal pads 120 of the optical modulator device 100 is excellent.

The lower sealing pad 250 is formed to correspond in position to the upper sealing pad 130 of the optical modulator device 100 attached to the light transmissive cover 200, and shields the micromirrors 110 of the optical modulator device 100 from an external environment (particularly, moisture). It is preferable that the lower sealing pad 250 be a metal layer including Au as a main component so that adhesion strength to the upper sealing pad 130 of the optical modulator device 100 is excellent.

The lower pads 260 for the driver integrated circuits are connected to pads of the driver integrated circuits 300a, 300b, 300c, 300d to act as paths for electrical signals passing through the driver integrated circuits 300a, 300b, 300c, 300d.

With reference to FIG. 5, the optical modulator module package according to the present invention uses a flip-chip mounting technology to connect the upper metal pads 120 of the optical modulator device 100 to the lower metal pads 240 of the light transmissive cover 200; thereby it is easy to transmit an electrical signal between the optical modulator device 100 and the exterior.

Additionally, the optical modulator module package according to the present invention uses a flip-chip mounting technology to connect the upper sealing pad 130 of the optical modulator device 100 to the lower sealing pad 250 of the light transmissive cover 200; thereby excellent sealing is assured to shield the optical modulator device 100 from an external environment and to maintain desirable optical characteristics of the optical modulator device 100.

With reference to FIGS. 2A and 2B, a plurality of driver integrated circuits 300a, 300b, 300c, 300d is flip-chip connected to the upper pads 310a, 310b, 310c, 310d around the optical modulator device 100 attached to the light transmissive cover 200, and provides driving voltage to the optical modulator device 100 depending on an electrical signal inputted from the exterior. In an embodiment, four driver integrated circuits 300a, 300b, 300c, 300d are provided, but its number may vary according to the necessity.

Holes (not shown) are formed through the printed circuit board 400 so that light is incident onto the optical modulator device 100, and the printed circuit board 400 has an internal circuit to transmit an electrical signal to the driver integrated circuits 300a, 300b, 300c, 300d therethrough. In connection with this, electrical connection is achieved using wire bonds 320 between the wire bonding pads 310 of the printed circuit board 400 and the wire bonding pads 220 connected to the driver integrated circuits 300a, 300b, 300c, 300d.

Figure 6:
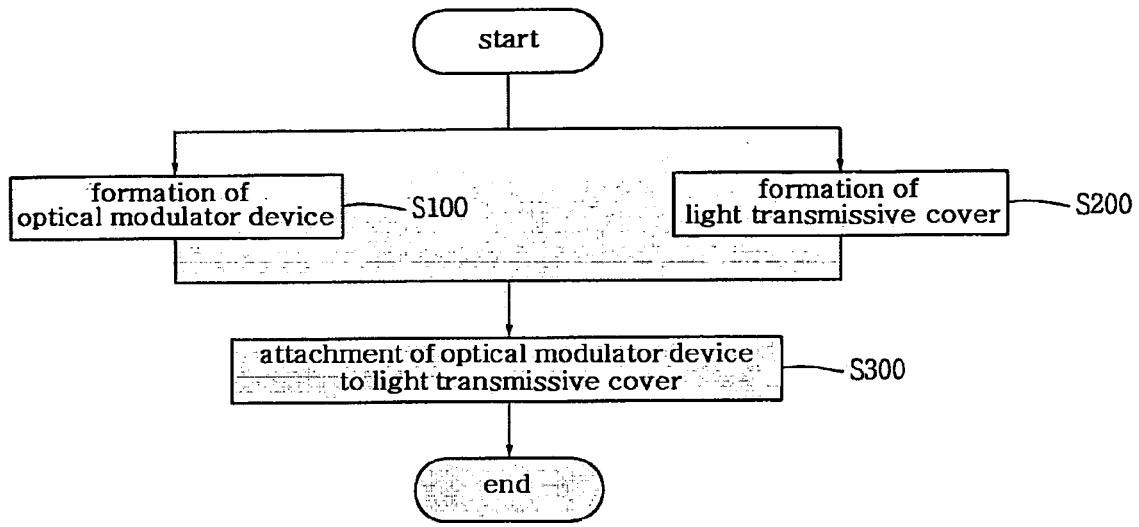
FIG. 6 is a flowchart illustrating the fabrication of the optical modulator module package using the flip-chip mounting technology according to the first embodiment of the present invention.
Figure 7A:
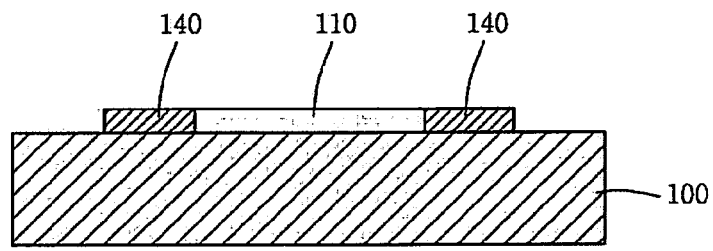
FIGS. 7A to 7C are sectional views illustrating the fabrication of the optical modulator device according to the first embodiment of the present invention.
Figure 7B:
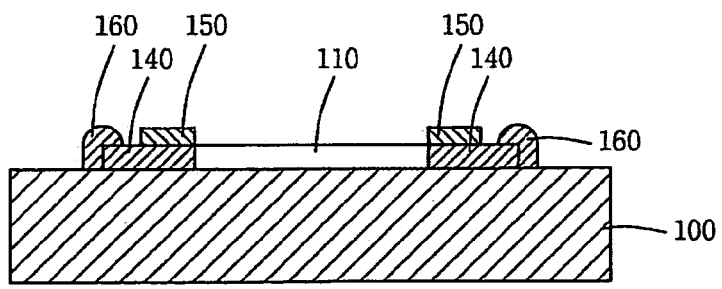
Figure 7C:
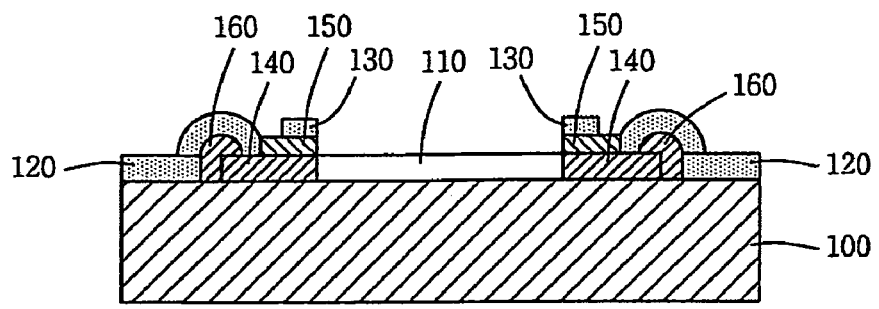
Figure 8A:
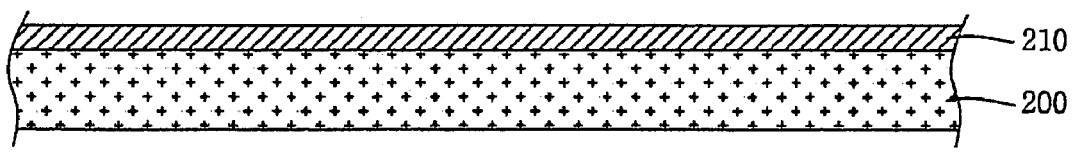
FIGS. 8A to 8G are sectional views illustrating the fabrication of the light transmissive cover according to the first embodiment of the present invention.
Figure 8B:
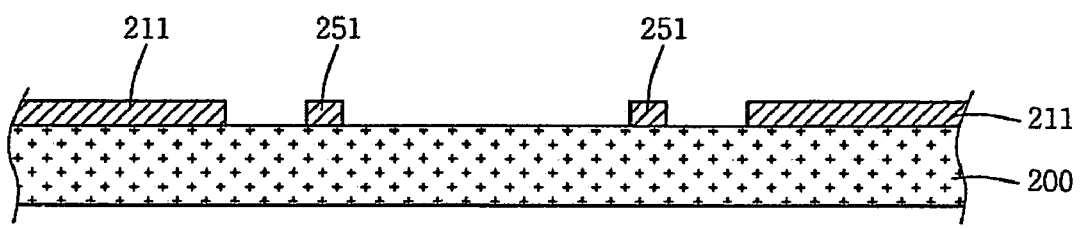
Figure 8C:
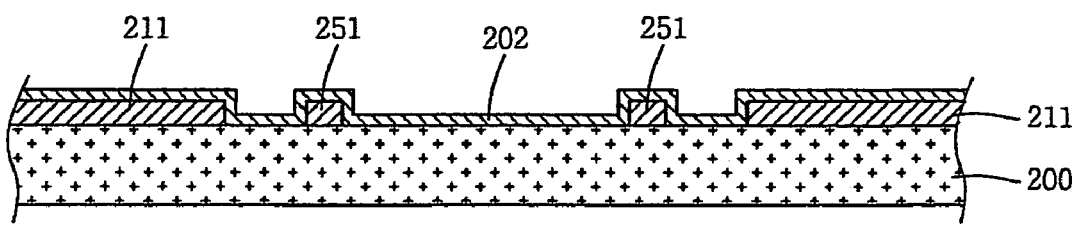
Figure 8D:
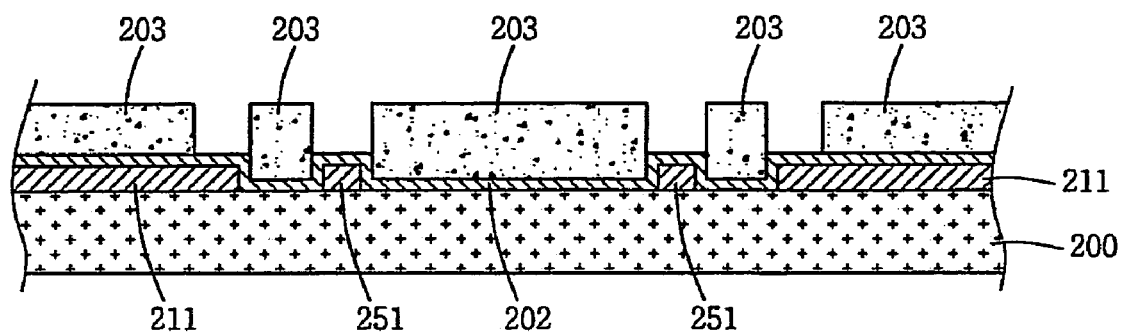
Figure 8E:
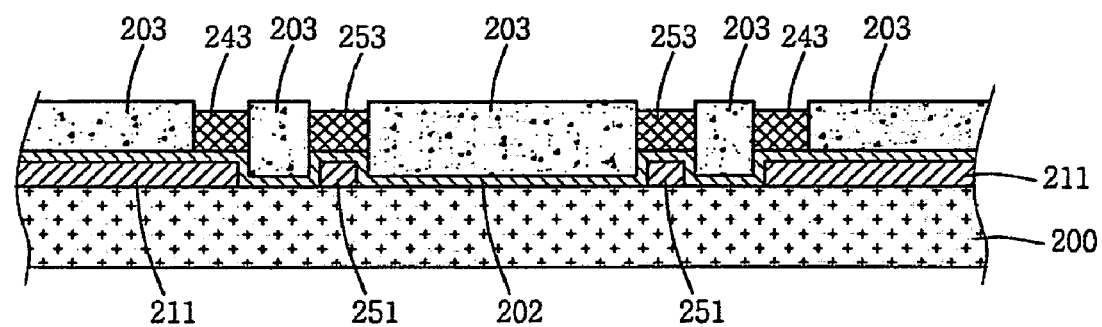
Figure 8F:
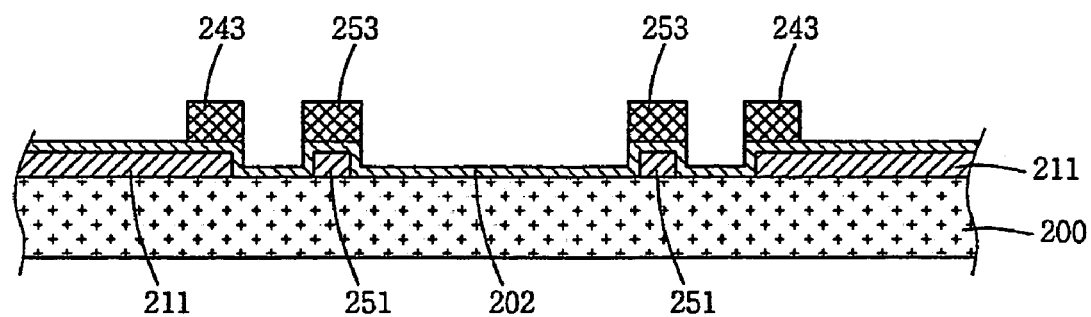
Figure 8G:
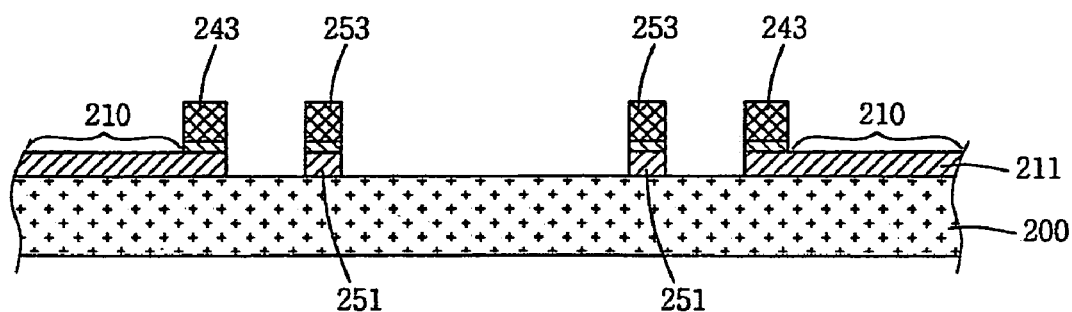
Figure 9A:
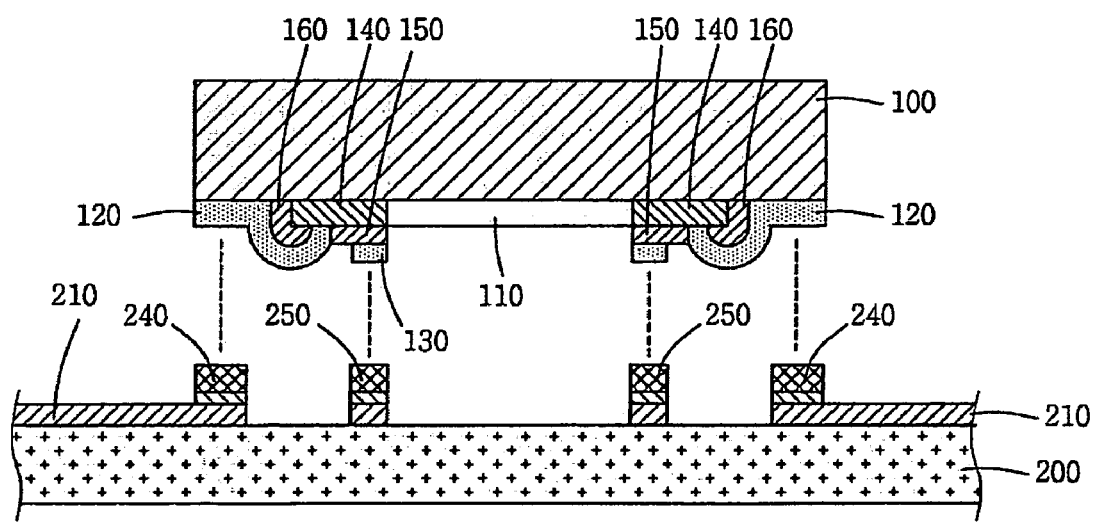
FIGS. 9A and 9B are sectional views illustrating attachment of the optical modulator device to the light transmissive cover according to the first embodiment of the present invention.
Figure 9B:
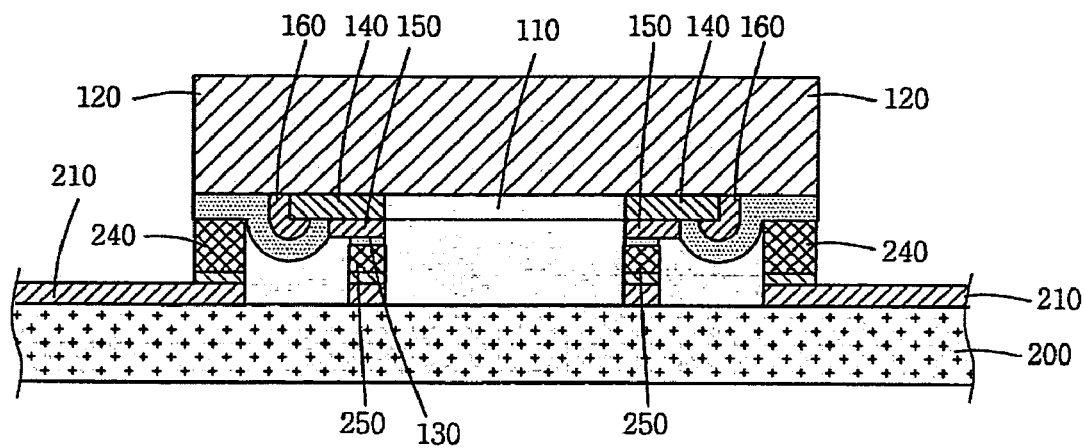

FIG. 6 is a flowchart illustrating the fabrication of the optical modulator module package using the flip-chip mounting technology according to the first embodiment of the present invention, FIGS. 7A to 7C are sectional views illustrating the fabrication of the optical modulator device according to the first embodiment of the present invention, FIGS. 8A to 8G are sectional views illustrating the fabrication of the light transmissive cover according to the first embodiment of the present invention, and FIGS. 9A and 9B are sectional views illustrating attachment of the optical modulator device to the light transmissive cover according to the first embodiment of the present invention.

As shown in FIG. 6, a method of producing the optical modulator module package using the flip-chip mounting technology according to the present invention comprises forming an optical modulator device (S100), forming a light transmissive cover (S200), and attaching the optical modulator device to the light transmissive cover (S300). The formation of the optical modulator device (S100) and the formation of the light transmissive cover (S200) may be separately conducted.

First, a detailed description will be given of the formation of the optical modulator device (S100). As shown in FIG. 7A, an optical modulator device 100 comprising a micromirror 110 and lead wires 140 connected to at least one side of the micromirror 110 is provided.

As shown in FIG. 7B, oxide layers, such as $SiO_2$, as insulating layers 150 are formed on the lead wires 140. In connection with this, insulating layers 160 may be additionally formed on walls of the lead wires 140. The insulating layers 150 which are formed on the lead wires 140 insulate the lead wires 140 from an upper sealing pad 130 to be formed during a subsequent process.

As shown in FIG. 7C, the upper sealing pad 130 is formed on the insulating layers 150 on the lead wires 140 using a photolithography process, and upper metal pads 120 are formed on external sides of the lead wires 140 so as to be connected to the lead wires 140. In connection with this, it is preferable that the upper sealing pad 130 and the upper metal pads 120 be metal layers including Au as a main component, and it is preferable to form a Au layer after a thin Cr layer is formed so as to improve adhesion strength between the optical modulator device 100 or the insulating layers 150, 160 and the Au layer.

To describe the formation of the light transmissive cover (S200) in detail, as shown in FIG. 8A, the Au layer is formed on a whole surface of the light transmissive cover 200, such as glass, in a thickness of about 0.5 µm using a sputtering process. In connection with this, it is preferable to form the Au layer after a thin TiW layer is formed so as to improve adhesion strength between the light transmissive cover 200 and the Au layer.

As shown in FIG. 8B, the Au layer formed on the light transmissive cover 200 is patterned using a photolithography process so as to correspond to circuit patterns 211 and a lower sealing pad 251.

As shown in FIG. 8C, a seed layer 202, including Au of about 0.1 µm, is formed on a whole surface of the patterned light transmissive cover 200 using a sputtering process. In connection with this, it is preferable to form the Au layer after a thin TiW layer is formed so as to improve adhesion strength between the light transmissive cover 200 and the seed layer 202.

As shown in FIG. 8D, a plating resist pattern is formed on the seed layer 202 on the light transmissive cover 200 using photoresists 203. In connection with this, a portion on which the photoresists 203 are not formed corresponds in position to lower metal pads and the lower sealing pad.

As shown in FIG. 8E, Au plating layers 243, 253 are formed on the portion on which the photoresists 203 are not formed using an electric plating process. In connection with this, the seed layer, which is formed on the whole surface of the light transmissive cover 200 in the process shown in FIG. 8C, is used as a lead-in wire for plating.

As shown in FIG. 8F, the photoresists 203 are then removed.

As shown in FIG. 8G, the seed layer 202 is then removed through an etching process in which the light transmissive cover 200 is dipped in an etching solution so as to form circuit patterns 210, lower metal pads 243, and lower sealing pads 251, 253 on the light transmissive cover 200.

Next, the attachment of the optical modulator device to the light transmissive cover (S300) will be described in detail. As shown in FIG. 9A, the optical modulator device 100, which is produced during a step of forming the optical modulator device (S100), and the light transmissive cover 200, which is produced during a step of forming the light transmissive cover (S200), are arranged.

As shown in FIG. 9B, the upper metal pads 120 of the optical modulator device 100 are connected to the lower metal pads 240 of the light transmissive cover 200, and the upper sealing pad 130 of the optical modulator device 100 is connected to the lower sealing pad 250 of the light transmissive cover 200.

Subsequently, a process of attaching a plurality of driver integrated circuits 300a, 300b, 300c, 300d to the light transmissive cover 200, a process of layering the light transmissive cover 200 on the printed circuit board 400, and a process of wire bonding the printed circuit board 400 to the light transmissive cover 200 to form the wire bonds 320 are conducted; thereby the optical modulator module package of the present invention is produced.

Figure 10:
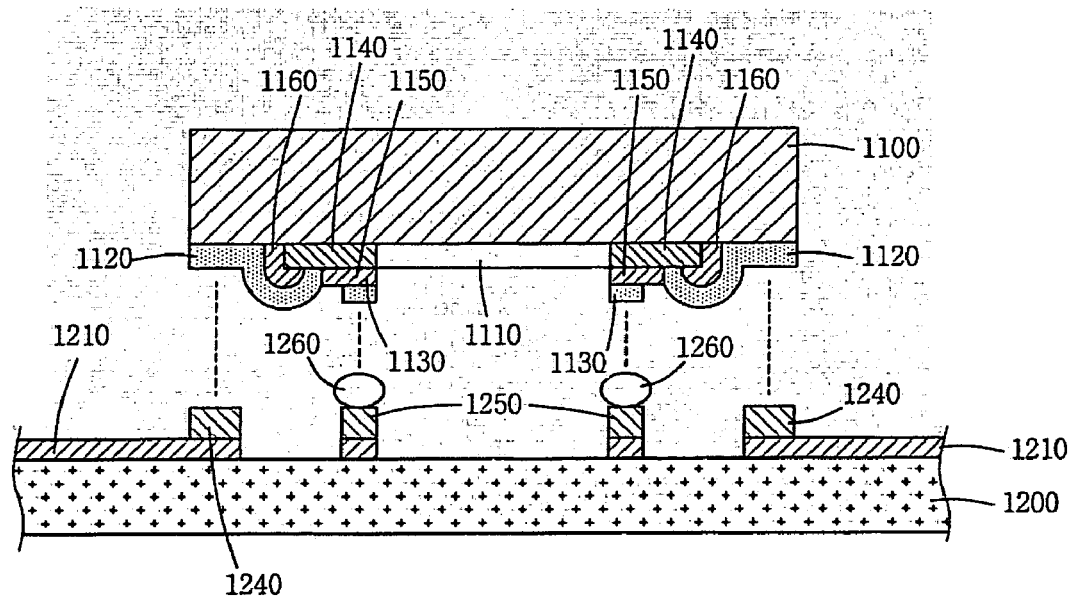
FIG. 10 is a sectional view illustrating attachment of an optical modulator device to a light transmissive cover using solder balls according to the second embodiment of the present invention.

FIG. 10 is a sectional view illustrating attachment of an optical modulator device to a light transmissive cover using solder balls according to the second embodiment of the present invention.

As shown in FIG. 10, an optical modulator device 1100 according to the second embodiment of the present invention comprises micromirrors 1110, upper metal pads 1120, an upper sealing pad 1130, lead wires 1140, and insulating layers 1150, 1160. A light transmissive cover 1200 comprises circuit patterns 1210, lower metal pads 1240, and a lower sealing pad 1250.

In the optical modulator module package according to the second embodiment of the present invention, the upper and lower sealing pads 1130, 1250 are connected using solder balls 1260, thus more reliable sealing is achieved. Furthermore, the upper and lower metal pads 1120, 1240 are connected using the solder balls 1260, thus more reliable electric connection is achieved.

Figure 11:
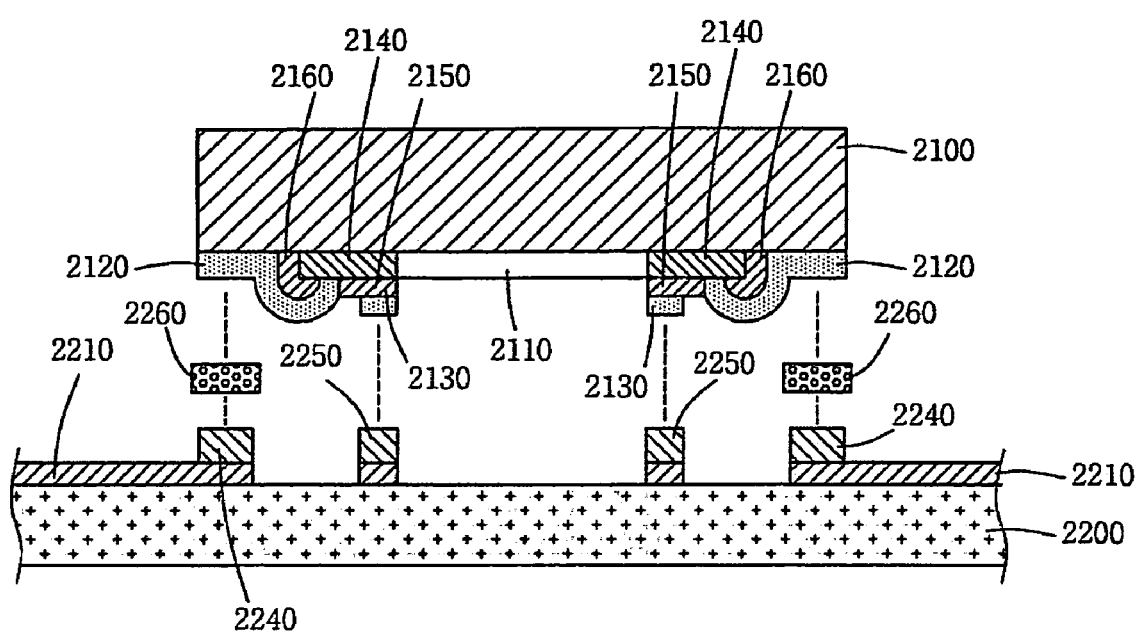
FIG. 11 is a sectional view illustrating attachment of an optical modulator device to a light transmissive cover using anisotropic conductive films according to the third embodiment of the present invention.

FIG. 11 is a sectional view illustrating attachment of an optical modulator device to a light transmissive cover using anisotropic conductive films according to the third embodiment of the present invention.

As shown in FIG. 11, an optical modulator device 2100 according to the third embodiment of the present invention comprises micromirrors 2110, upper metal pads 2120, an upper sealing pad 2130, lead wires 2140, and insulating layers 2150, 2160. A light transmissive cover 2200 comprises circuit patterns 2210, lower metal pads 2240, and a lower sealing pad 2250.

In the optical modulator module package according to the third embodiment of the present invention, the upper and lower metal pads 2120, 2240 or the upper and lower sealing pads 2130, 2250 are connected to each other using anisotropic conductive films 2260, thus a load applied to the optical modulator device 2100 or the light transmissive cover 2200 is reduced; thereby it is possible to prevent the optical modulator device 2100 or the light transmissive cover 2200 from being damaged.

In another preferred embodiment, in an optical modulator module package according to the present invention, upper metal pads 2120 of an optical modulator device 2100 and lower metal pads 2240 of a light transmissive cover 2200 may be connected to each other using an anisotropic conductive film or a non-conductive film (NCF) so as to avoid bending of the device or nonuniform heights of bumps, thus stable performance is assured.

As described above, an optical modulator module package using a flip-chip mounting technology according to the present invention is advantageous in that electrical signal connection and hermetic mounting of an optical modulator device are simultaneously conducted using the flip-chip mounting technology; thereby the optical modulator device is protected from an external environment, it is easy to transmit an electrical signal to the exterior, and optical characteristics of the optical modulator device are desirably maintained.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An optical modulator module package using a flip-chip mounting technology, comprising:
   an optical modulator device, comprising:
      micromirrors formed on a lower side thereof to modulate light incident from an exterior;
      upper metal pads spaced apart from at least one side of the micromirrors to transmit an electrical signal from the exterior to the micromirrors therethrough; and
      an upper sealing pad formed between the micromirrors and the upper metal pads to surround the micromirrors; and
   a light transmissive cover, comprising:
      lower metal pads formed thereon to correspond in position to the upper metal pads of the optical modulator device; and a lower sealing pad formed to correspond in position to the upper sealing pad of the optical modulator device.

2. The optical modulator module package as set forth in claim 1, further comprising:

at least one driver integrated circuit formed around the optical modulator device connected to the light transmissive cover so as to provide driving voltage to the optical modulator device depending on the electrical signal inputted from the exterior; and a printed circuit board attached to a lower side of the light transmissive cover, through which holes are formed to pass incident light therethrough.

3. The optical modulator module package as set forth in claim 1, wherein at least one connection of the connection of the upper metal pads of the optical modulator device and the lower metal pads of the light transmissive cover, and the connection of the upper sealing pad of the optical modulator device and the lower sealing pad of the light transmissive cover, is conducted using a solder ball.

4. The optical modulator module package as set forth in claim 1, wherein at least one connection of the connection of the upper metal pads of the optical modulator device and the lower metal pads of the light transmissive cover, and the connection of the upper sealing pad of the optical modulator device and the lower sealing pad of the light transmissive cover, is conducted using an anisotropic conductive film.

* * * * *